[12] United States Patent  
Jackson et al.

(10) Patent No.: US 6,962,867 B2
(45) Date of Patent: Nov. 8, 2005

(54) METHODS OF FABRICATION OF SEMICONDUCTOR DICE HAVING BACK SIDE REDISTRIBUTION LAYER ACCESSED USING THROUGH-SILICON VIAS AND ASSEMBLIES THEREOF

(75) Inventors: Timothy L. Jackson, Eagle, ID (US); Tim E. Murphy, Boise, ID (US)

(73) Assignee: MicronTechnology, Inc., Boise, ID (US)

( * ) Notice: Subject to any disclaimer, the term of this patent is extended or adjusted under 35 U.S.C. 154(b) by 41 days.

(21) Appl. No.: 10/732,558

(22) Filed: Dec. 10, 2003

(65) Prior Publication Data

US 2004/0121521 A1 Jun. 24, 2004

Related U.S. Application Data

(62) Division of application No. 10/209,823, filed on Jul. 31, 2002, now Pat. No. 6,800,930.

(51) Int. Cl.[7] .................... H01L 21/4763; H01L 21/44
(52) U.S. Cl. .................. 438/622; 438/639; 438/672
(58) Field of Search ................ 438/107, 109, 438/622, 639, 672, 455; 257/750, 758, 774

(56) References Cited

U.S. PATENT DOCUMENTS

| | | | | |
|---|---|---|---|---|
| 3,648,131 A | * | 3/1972 | Stuby | 257/622 |
| 3,761,782 A | * | 9/1973 | Youmans | 257/778 |
| 4,833,521 A | | 5/1989 | Early | 257/664 |
| 5,386,142 A | | 1/1995 | Kurtz et al. | 257/690 |
| 5,455,445 A | | 10/1995 | Kurtz et al. | 257/419 |
| 5,762,744 A | * | 6/1998 | Shibata et al. | 156/235 |
| 5,872,051 A | | 2/1999 | Fallon et al. | 438/616 |
| 5,950,304 A | | 9/1999 | Khandros et al. | 29/631 |
| 5,973,396 A | | 10/1999 | Farnworth | 257/698 |
| 5,994,766 A | | 11/1999 | Shenoy et al. | 257/659 |
| 6,011,314 A | | 1/2000 | Leibovitz et al. | 257/781 |
| 6,018,196 A | | 1/2000 | Noddin | 275/779 |
| 6,020,220 A | | 2/2000 | Gilleo et al. | 438/119 |
| 6,025,647 A | | 2/2000 | Shenoy et al. | 257/799 |
| 6,048,753 A | | 4/2000 | Farnworth et al. | 438/11 |
| 6,166,444 A | | 12/2000 | Hsuan et al. | 257/777 |
| 6,168,969 B1 | | 1/2001 | Farnworth | 438/106 |
| 6,225,143 B1 | | 5/2001 | Rao et al. | 438/106 |
| 6,261,375 B1 | | 7/2001 | Siniaguine et al. | 118/70 |
| 6,287,976 B1 | | 9/2001 | Siniaguine et al. | 438/176 |
| 6,322,903 B1 | | 11/2001 | Siniaguine et al. | 428/617 |
| 6,323,134 B1 | | 11/2001 | Siniaguine | 438/716 |
| 6,429,096 B1 | | 8/2002 | Yanagida | 438/459 |
| 2002/0125566 A1 | * | 9/2002 | Tonami et al. | 257/728 |
| 2003/0003724 A1 | * | 1/2003 | Uchiyama et al. | 438/667 |

FOREIGN PATENT DOCUMENTS

JP 09-321175 A 12/1997 ........... H01L/23/12

OTHER PUBLICATIONS

Advertisement, "Laser Micromachining," MicroConnex Systems, 34935 SE Douglas Street, Snoqualmie, WA 98065.

(Continued)

*Primary Examiner*—William M. Brewster
(74) *Attorney, Agent, or Firm*—TraskBritt, PC

(57) ABSTRACT

An apparatus and method of rerouting redistribution lines from an active surface of a semiconductor substrate to a back surface thereof and assembling and packaging individual and multiple semiconductor dice with such rerouted redistribution lines formed thereon. The semiconductor substrate includes one or more vias having conductive material formed therein and which extend from an active surface to a back surface of the semiconductor substrate. The redistribution lines are patterned on the back surface of the semiconductor substrate, extending from the conductive material in the vias to predetermined locations on the back surface of the semiconductor substrate that correspond with an interconnect pattern of another substrate for interconnection thereto.

28 Claims, 6 Drawing Sheets

OTHER PUBLICATIONS

Advertisement, "ESI 520 Drilling Station," MicroConnex Systems, 34935 SE Douglas Street, Snoqualmie, WA 98065.

Advertisement, "Damage Free Thinning," Tru–Si Technologies, 657 North Pastoria Ave., Sunnyvale, CA 94085.

Advertisement, "Through–Silicon Vias," Tru–Si Technologies, 657 North Pastoria Ave., Sunnyvale, CA 94085.

Advertisement, "TE–2001–M," Tru–Si Technologies, 657 North Pastoria Ave., Sunnyvale, CA 94085.

Advetisement, "TE–2001–UT," Tru–Si Technologies, 657 North Pastoria Ave., Sunnyvale, CA 94085.

http://www.trusi.com/article9.htm, Savastiouk, Sergey, "New Process Forms Die Interconnects by Vertical Wafer Stacking," pps. 1–2, *chipScale Review*.

http://www.trusi.com/article7.htm, Savastiouk, Sergey, "Moore's Law—the z dimension," pps. 1–3, *Solid State Technology*.

http://www.trusi.com/articlefchip1.htm, Francis, David, "Thinning Wafers For Flip Chip Applications," pps. 1–8, *High Density Interconnect*.

http://www.trusi.com/articlesb2.htm, Savastiouk et al., "Thinner packages vital for third–dimensional expansion," pps. 1–6, *The Next Dimension, Advanced Packaging*, Sep./Oct. 1998.

http://www.trusi.com/articles2.htm, Savastiouk, Sergey, "A new start–up promises to revelutionize wafer thinning and boost chip packaging density," pps. 1–3, *Semiconductor European*, Aug. 1998.

http://www.trusi.com/articlese1.htm, Savastiouk, Sergey, "Atomospheric Downstream Plasma–An Approach to 300–mm Wafer Thinning, Semi Global 300mm Report," pps. 1–4, *Semi Global* 300mm Report, Jul. 1998.

http://www.trusi.com/articlesf1.htm, Savastiouk et al., "Atmospheric downstream plasma—a new tool for semiconductor processing," pps. 1–6, *Solid State Technology*, Jul. 1998.

http://www.trusi.com/oleg1.htm, Siniaguine, Oleg, "Atmospheric Downstream Plasma Etching of Si Wafers," pps. 1–9.

\* cited by examiner

METHODS OF FABRICATION OF SEMICONDUCTOR DICE HAVING BACK SIDE REDISTRIBUTION LAYER ACCESSED USING THROUGH-SILICON VIAS AND ASSEMBLIES THEREOF

CROSS-REFERENCE TO RELATED APPLICATION

This application is a divisional of application Ser. No. 10/209,823, filed Jul. 31, 2002, now U.S. Pat. No. 6,800,930, issued Oct. 5, 2004.

BACKGROUND OF THE INVENTION

1. Field of the Invention

The present invention relates generally to methods and apparatus for assembling one or more semiconductor dice with a substrate. In particular, the present invention relates to methods and apparatus for electrically interconnecting a back side of one or more semiconductor dice to a carrier substrate and various assembly and stacking arrangements implemented using back side electrical interconnections of semiconductor dice.

2. State of the Art

Interconnection and packaging-related issues are among the factors that determine not only the number of circuits that can be integrated on a semiconductor die or "chip," but also the performance of the chip. These issues have gained in importance as advances in chip design have led to reduced sizes of transistors and enhanced chip performance. The industry has come to realize that merely having a fast chip will not necessarily result in a fast system; the fast chip must also be supported by equally fast and reliable electrical connections. Essentially, on-chip connections, in conjunction with those of the chip's associated packaging, supply the chip with signals and power, provide signals from the chip and redistribute the tightly spaced or pitched terminals or bond pads of the chip to the terminals of a carrier substrate such as a printed circuit board.

Flip-chip technology, its fabrication and use are well known to those of ordinary skill in the art, as the technology has been in use for over 30 years and continues to develop. A flip-chip semiconductor device conventionally comprises a semiconductor die having an active surface having active integrated circuitry components formed therein and bearing contacts such as bond pads, and an opposing back surface or "back side" devoid of active components or, usually, of any components whatsoever. A dielectric layer, for example, of silicon dioxide or silicon nitride, is formed over the active surface by techniques well known in the art. Apertures are defined in the dielectric layer (also termed a passivation layer), for example, using well-known photolithographic techniques to mask and pattern the dielectric layer and etch the same, for example, with buffered HF to expose the contacts or bond pads on the active surface. The bond pads may be respectively connected to traces of a redistribution layer on the dielectric layer in the form of redistribution lines, i.e., power, ground and signal lines, in a well-known manner, for example, by evaporating or sputtering a layer of aluminum or an alloy thereof over the passivation layer, followed by masking and etching to define the traces. The redistribution lines of the redistribution layer enable the external connections of the semiconductor device provided by the relatively compact arrangement of closely spaced or pitched bond pads to be distributed over a larger surface area with wider spacing or pitch between external connections to higher-level packaging. Solder bumps, or balls, are typically placed upon a pad located at an end of each redistribution line to enable electrical coupling with contact pads or terminals on the higher-level packaging, typically comprising a carrier substrate, such as a printed circuit board. The flip-chip semiconductor device, with the solder bumps on its active surface, is "flipped" and attached face down to a surface of the carrier substrate, with each solder bump on the semiconductor device being positioned on the appropriate contact pad or terminal of the carrier substrate. The assembly of the flip-chip semiconductor device and the carrier substrate is then heated so as to reflow the solder bumps to a molten state and thus connect each bond pad on the semiconductor device through its associated redistribution line and solder bump to an associated contact pad or terminal on the carrier substrate.

Because the flip-chip arrangement does not require leads of a lead frame or other carrier structures coupled to a semiconductor die and extending beyond the lateral periphery thereof, it provides a compact assembly in terms of the semiconductor die's "footprint" on the carrier substrate. In other words, the area of the carrier substrate within which the contact pads or terminals are located is, for a given semiconductor die, the same as or less than that occupied by the semiconductor die itself. Furthermore, the contacts on the die, in the form of widely spaced or pitched solder bumps, may be arranged in a so-called "area array" disposed over substantially the entire active surface of the die. Flip-chip bonding, therefore, is well suited for use with dice having large numbers of I/O contacts, in contrast to wire bonding and tape-automated bonding techniques which are more limiting in terms of the number of bond pads which may reasonably and reliably be employed. As a result, the maximum number of I/O contacts and power/ground terminals available can be increased without substantial difficulty, and signal and power/ground interconnections can be more efficiently routed on the semiconductor die. Examples of methods of fabricating semiconductor die assemblies using flip-chip and other techniques are described in U.S. Pat. No. 6,048,753 to Farnworth et al., U.S. Pat. No. 6,018,196 to Noddin, U.S. Pat. No. 6,020,220 to Gilleo et al., U.S. Pat. No. 5,950,304 to Khandros et al., and U.S. Pat. No. 4,833,521 to Early.

As with any conductive line carrying a signal, the redistribution lines for integrated circuits generate electromagnetic and electrostatic fields, or "cross-talk." These electromagnetic and electrostatic fields may affect the signals carried in adjacent redistribution lines unless some form of compensation is used. Examples of redistribution lines formed over the active circuitry in a flip-chip semiconductor device that disclose methods of limiting cross-talk are illustrated in U.S. Pat. Nos. 5,994,766 and 6,025,647, each to Shenoy et al.

Electromagnetic and electrostatic coupling between redistribution lines, or cross-talk, is undesirable because it increases the impedance of the redistribution lines and may create impedance mismatching and signal delays. Significant factors affecting cross-talk between adjacent redistribution lines include redistribution line length, the distance between the adjacent redistribution lines and the dielectric constant ($\epsilon_r$) of the material between the adjacent redistribution lines. For flip-chip devices, where a large number of bond pads with associated redistribution lines on the active surface are used to carry signals to and from various external connection locations with higher-level packaging for convenient access, impedance can be a significant factor affecting the speed of the system. The location of redistribution lines on the active surface also severely limits the location, size and number of passive circuit elements such as resistors, capacitors and inductors which may be used to compensate for cross-talk or otherwise enhance performance of the packaged semiconductor device without undesirably enlarging the size thereof. Further, such impedance problems affecting the speed of the semiconductor device are only compounded when stacking multiple flip-chip devices.

Therefore, it would be advantageous to prevent cross-talk between adjacent redistribution lines on the active surface of a flip-chip configured semiconductor die while also maintaining a large number of available, widely spaced or pitched I/O terminals and, further, maintaining or even reducing the size of the semiconductor die and associated footprint. It would also be advantageous to provide a flip-chip configured semiconductor die that offers improved stacking capabilities without compounding impedance problems, may be tailored to provide physical and thermal stress relief, and may be configured to provide enhanced resistive, inductive and capacitive electrical characteristics to the packaged semiconductor die.

BRIEF SUMMARY OF THE INVENTION

The present invention relates to methods and apparatus for rerouting redistribution lines from an active surface of a semiconductor device substrate such as a semiconductor die to the back surface thereof and assembling and packaging individual and multiple semiconductor dice with such rerouted redistribution lines formed thereon. The rerouted redistribution lines formed on the back surface of the semiconductor substrate may be located, configured and oriented to substantially reduce and even prevent cross-talk in comparison to those which might ordinarily be located on an active surface of the semiconductor substrate and to provide physical and thermal stress relief in assemblies formed with such semiconductor substrate. Further, rerouting such redistribution lines to the back surface of the semiconductor substrate may be used to maintain or even further reduce the footprint of the resulting individual semiconductor die or dice after packaging and provides additional space for additional electrical components on both the active surface and the back surface of the semiconductor substrate.

The present invention includes a semiconductor substrate comprising one or more semiconductor dice. Such semiconductor substrate may be in wafer or other bulk substrate form, an interconnected array of semiconductor dice such as a partial wafer, or a single semiconductor die. In any case, the semiconductor substrate includes an active surface and a back surface with at least one via extending from the active surface to the back surface and having conductive material therein. At least one redistribution line is formed over the back surface of the semiconductor substrate to extend from the conductive material in the at least one via to a predetermined location on the back surface of the semiconductor substrate.

According to one aspect of the present invention, redistribution lines are routed to specific locations on the back surface of the semiconductor substrate to correspond with an interconnect pattern of another, adjacent substrate such as a carrier substrate for attachment thereto. Additionally, the redistribution lines interconnect with the active circuitry on the active surface of the semiconductor substrate and may also interconnect with additional electronic components as well as with circuitry of other semiconductor substrates stacked thereon or thereunder. Rerouting redistribution lines to the back surface of the semiconductor substrate thus limits the necessary footprint for a semiconductor die and provides improved assembly and stacking configurations that provide physical and thermal stress relief therein.

The electronic components which may be integrated in the back surface of the semiconductor substrate with redistribution lines extending thereto may include, by way of example only, capacitors, inductors, resistors, fuses, controllers and/or additional circuits. Such electronic components may be discrete and configured to remove or reroute thermal and electrical stresses from the active surface to the back surface as well as enabling more even distribution of stresses over the active surface.

According to another aspect of the present invention, the semiconductor substrate may be attached to another substrate, such as a carrier substrate like an interposer or printed circuit board. In particular, the back surface of the semiconductor substrate may be attached to the other substrate with the ends of the redistribution lines distal from the vias positioned and configured to correspond to an interconnection pattern of the other substrate. In this configuration, the resulting assembly provides that the active surface of the semiconductor substrate is facing upward with the back surface attached to the other substrate. Conductive bumps or pillars may be placed between the distal ends of the redistribution lines and the corresponding electronic interconnects such as contact pads or terminals on the other substrate. A dielectric filler material may also be provided between the semiconductor substrate and the other substrate for environmental protection of the conductive interconnections therebetween and enhanced mechanical bonding of the two substrates.

According to the present invention, the redistribution line on the back surface of a semiconductor substrate enable various embodiments of semiconductor substrate stacking arrangements. The stacking arrangements may include embodiments of active surface-on-active surface attachment, back surface-on-active surface attachment, back surface-on-back surface attachment and active surface-on-back surface attachment of semiconductor substrates. In each of the various stacking arrangements, conductive bumps, studs or pillars may be utilized for electrical interconnection between the stacked semiconductor substrates. An appropriate dielectric filler material may be applied between adjacent semiconductor dice.

In another aspect, the semiconductor substrate of the present invention is fabricated by forming vias in "dead space" on the active surface side of the semiconductor substrate. Such vias may be formed by drilling or laser ablation or any other suitable known method so that the vias are defined by at least one sidewall and a bottom wall. A thin insulative film, such as silicon dioxide, is formed on via wall surfaces, after which a conductive material may be used to fill the vias. Thinning of the semiconductor substrate is then effected by, for example, grinding or etching the back surface of the semiconductor substrate to remove a predetermined depth of semiconductor material. The back surface may then be etched by either a dry or wet etch and/or polished by abrasive polishing techniques such as so-called chemical mechanical polishing, or "CMP," to expose the conductive material in the vias. A redistribution layer precursor of metal may then be deposited and patterned on the back surface of the semiconductor substrate to form redistribution lines. Such patterning may be employed by etching excess portions of the redistribution layer precursor therefrom. The redistribution lines are located, configured and oriented to extend from the conductive material-filled vias to predetermined remote locations on the back surface that will correspond with the interconnection pattern of another substrate. Conductive bumps, such as solder balls, may be disposed or formed on portions of the redistribution lines, typically ends thereof distal from the associated via, to provide an interconnect between the semiconductor substrate and the substrate, such as a carrier substrate, circuit board, or another semiconductor substrate. It is also contemplated that the ends of the vias on the active surface of the substrate may also be used to electrically interconnect the semiconductor substrate to another semiconductor or other type of substrate placed thereover and having appropriately located contacts thereon.

In another aspect of the present invention, the semiconductor substrate of the present invention is mounted to a circuit board in an electronic system, such as a computer system. In the electronic system, the circuit board is electrically connected to a processor device which also electrically communicates with an input device and an output device.

Other features and advantages of the present invention will become apparent to those of skill in the art through a consideration of the ensuing description, the accompanying drawings and the appended claims.

DETAILED DESCRIPTION OF THE INVENTION

Figure 1:
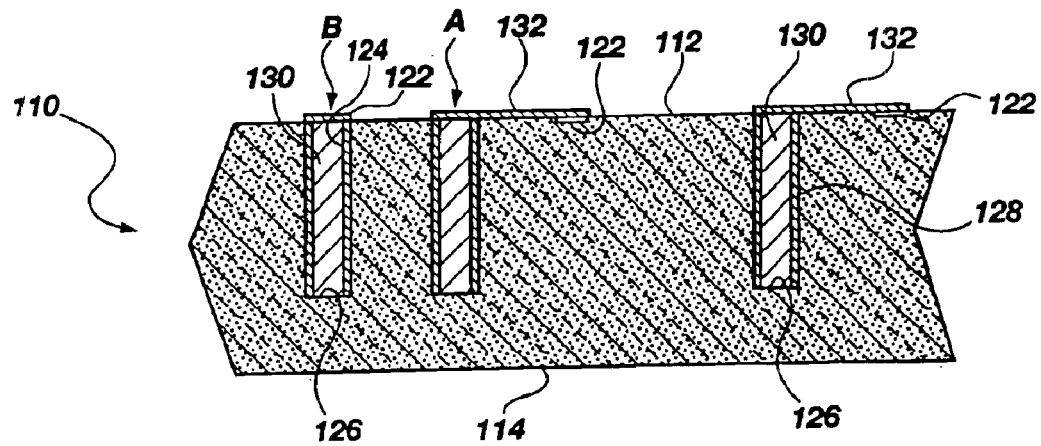
FIG. 1 illustrates a simplified cross-sectional side view of a semiconductor substrate having vias formed into an active surface thereof and filled with conductive material, according to the present invention.

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures retain the same numerical designation.

Figure 2:
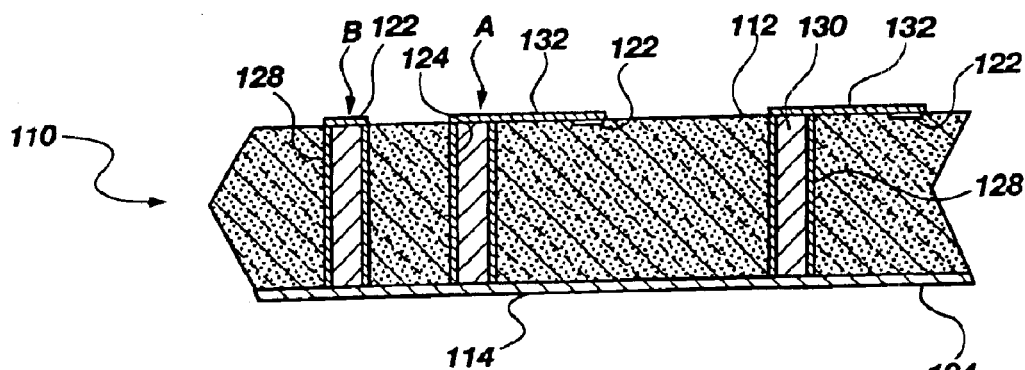
FIG. 2 illustrates a simplified cross-sectional side view of a thinned semiconductor substrate with vias filled with conductive material extending from an active surface to a back surface thereof and a redistribution layer precursor formed on the back surface of the thinned substrate, according to the present invention.
Figure 3:
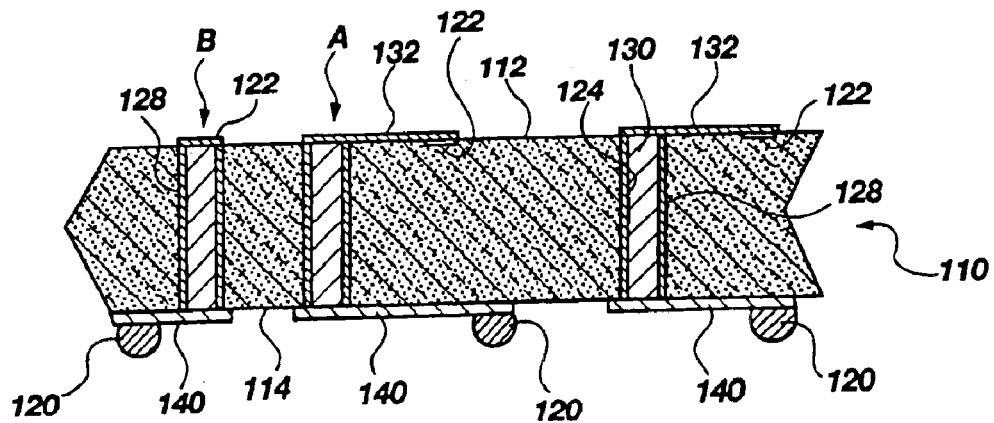
FIG. 3 illustrates a simplified cross-sectional side view of the thinned semiconductor substrate of FIG. 2 with the redistribution layer precursor patterned into redistribution lines and interconnected with the conductive material in the vias in the thinned semiconductor substrate, according to the present invention.

FIGS. 1–3 illustrate a process that may be used for fabricating a semiconductor die including redistribution lines on a back surface of a semiconductor substrate 110 and interconnected to conductive material in vias extending through the semiconductor substrate 110. The semiconductor substrate 110 is preferably in wafer form with rows and columns of interconnected semiconductor dice, but may comprise an array of interconnected semiconductor dice or a single semiconductor die. The semiconductor substrate 110 is preferably formed from silicon, but may be formed from gallium arsenide, indium phosphide or any other known semiconducting material whose electrical conductivity and resistivity lie between those of a conductor and an insulator.

As depicted in FIG. 1, the semiconductor substrate 110 includes an active surface 112 and a back surface or back side 114, with integrated circuitry (not shown) formed on the active surface 112 thereof, as known in the art. The active surface 112 of the semiconductor substrate 110 includes a plurality of vias 124 extending therein substantially perpendicular to the plane of semiconductor substrate 110, each via 124 having a bottom wall 126 at a predetermined distance into the semiconductor substrate 110 from active surface 112. The vias 124 may be formed in portions of "dead space" in the active surface 112, being portions of the semiconductor substrate 110 without integrated circuitry formed therein. Such vias 124 may be formed by drilling, by laser ablation or by any other suitable method known in the art. Laser ablation may be effected using equipment, such as the Model 5000-series lasers, offered currently by ElectroScientific Industries of Portland, Oreg. One specific, suitable piece of equipment is a 355 nm wavelength UV YAG laser, Model 2700, which may be used to form vias as little as 25 $\mu$m in diameter. One hundred pulses using this laser will form a 750 $\mu$m deep via through silicon. If desired, a TMAH (tetramethyl ammonium hydroxide) solution may be used to clean the via, which also results in a squared cross-section for the via.

One other suitable technology for forming the vias 124 is the so-called atmospheric downstream plasma (ADP) process offered by Tru-Si Technologies, Inc. of Sunnyvale, Calif. As applied to via formation, the ADP process is implemented using an aluminum mask layer formed over the active surface of a semiconductor substrate patterned with apertures to define via locations. An argon carrier gas is employed, with fluorine as the reactant gas. The etch effected is substantially isotropic.

After the vias 124 are formed in the active surface 112 of the semiconductor substrate 110, one or more dielectric layers 128, such as a silicon dioxide or the like, may be formed over the walls of the vias 124. The silicon dioxide may be formed by a thermal oxidation process, as known in the art. Then the vias 124 may be filled with a conductive material 130, such as aluminum, copper and/or alloys thereof or a conductive or conductor-filled epoxy. An additional layer such as Ti—W may be formed over the dielectric layer 128 to promote adhesion with a conductive filler, such as copper.

Yet another approach to forming vias 124 and providing conductors therethrough is disclosed in U.S. Pat. Nos. 5,973,396 and 6,168,969, issued to Warren M. Farnworth and assigned to the assignee of the present invention, the disclosures of each of which patents being incorporated herein by reference. The '396 and '969 patents disclose conductive doping (using Au or Al, for example) of a semiconductive material, such as silicon, from which a semiconductor die is formed, to provide conductive vias therethrough. Additional details of the technology are disclosed in U.S. Pat. Nos. 5,455,445 and 5,386,142, the disclosures of each of which patents being incorporated herein by reference. Beneficial vertical diffusion of the conductive dopant may be enhanced while curtailing lateral spread of the diffused conductor through selective crystallographic orientation of the matrix of silicon or other semiconductive die material to facilitate channeling of the conductive material through the matrix. An alternative to diffusion is ion-implantation of the conductor material, which is relatively rapidly effected in comparison to diffusion techniques and similarly limits undesirable lateral spread of the conductive material of the via.

A conductive layer, such as a metal, may then be formed over the active surface 112 of the semiconductor substrate 110. Such conductive layer may be etched or patterned to form conductive traces 132 to interconnect the conductive material 130 in the vias 124 and bond pads 122 on the active surface 112. The bond pads 122 are typically electrically interconnected to the integrated circuitry previously formed on the active surface 112 of the semiconductor substrate 110. The conductive traces 132 may also comprise a redistribution layer over the active surface 112, as known in the art, to enable stacking of semiconductor substrates as referenced in further detail below.

According to one aspect of the present invention, the conductive traces 132 patterned and interconnected with the conductive material 130 on the active surface 112 of the semiconductor substrate 110 comprises two interconnect types, namely interconnect type A and interconnect type B. Interconnect type A may include a conductive trace 132 extending from a bond pad 122 and associated active circuitry on the active surface 112 of the semiconductor substrate 110 to the conductive material 130 formed in the vias 124 to electrically interconnect the conductive material 130 with the active circuitry of the semiconductor substrate 110. Alternately, a conductive trace 132 may extend from conductive material 130 of a via 124 to a "dummy" bond pad location which is unconnected to any circuitry of semiconductor substrate 110. Interconnect type B may eliminate the conductive trace 132 and instead be structured as a bond pad 122 disposed on a top surface of the conductive material 130. An exemplary bond pad size is about 100 μm. Interconnect type B may also be electrically connected to or electrically isolated from any active circuitry on the active surface 112 of the semiconductor substrate 110.

FIG. 2 illustrates the semiconductor substrate 110 being thinned from the back surface 114 to a predetermined thickness or depth to remove or at least expose the bottom walls 126 of the vias 124 above which the conductive material 130 resides in the vias 124. Such thinning may be effected by, for example, mechanically grinding the back surface 114 down or by spin etching the back surface 114, both as known in the art. If required, the back surface 114 may then be etched by either a dry etch or wet etch to expose the conductive material 130. Also, the back surface 114 may be polished by abrasive techniques such as chemical-mechanical polishing or any known controlled process to remove the back surface material to a predetermined extent, exposing the conductive material 130 formed in the vias 124 through the back surface 114 of the semiconductor substrate 110. Yet another suitable thinning technology is the ADP process referenced above, offered by Tru-Si Technologies, Inc. of Sunnyvale, Calif.

After thinning the semiconductor substrate 110 to the predetermined extent, a redistribution layer precursor 134 is formed on the back surface 114 of the semiconductor substrate 110. The redistribution layer precursor 134 may be any known conductive material, such as, for example, copper or aluminum or an alloy thereof. The redistribution layer precursor 134 may be formed on the back surface 114 utilizing chemical vapor deposition (CVD), plasma enhanced CVD, also known as physical vapor deposition (PVD), sputtering, evaporation or otherwise, as known in the art. For example, redistribution layer precursor 134 may comprise a thin metal foil adhered to the back surface 114. In any case, the redistribution layer precursor 134 is formed such that it is in contact with the exposed surface of the conductive material 130 in the vias 124. The back surface 114 may, if desired, optionally be covered with a dielectric layer (not shown) such as silicon dioxide, silicon nitride or a polymer such as polyimide prior to application of the redistribution layer precursor 134.

As depicted in FIG. 3, the redistribution layer precursor 134 is then etched in a predetermined pattern so as to form redistribution lines 140. The redistribution lines 140 are patterned on the back surface 114 of the semiconductor substrate 110 to respectively extend from the conductive material 130 in associated vias 124 to predetermined distal locations on the back surface 114 thereof. As well known in the art, patterning the redistribution layer precursor 134 to form redistribution lines 140 may be accomplished by masking and patterning of a resist, such as a positive or negative photoresist, followed by a dry etch or wet etch. Alternatively, redistribution lines 140 may be printed using a conductive or conductor-filled polymer on back surface 114 or applied as preformed traces from a thin carrier film, which may then be removed or remain as a dielectric layer on back surface 114.

Conductive bumps 120 may be formed and configured on the redistribution lines 140 proximate the predetermined distal locations to correspond and interconnect with an interconnect pattern defined by contact pads or terminals of another substrate. Conductive bumps 120 may comprise, for example, solder balls of tin and lead which are preformed and placed on redistribution lines 140 and then at least partially reflowed or masses of solder paste which are stenciled on back surface 114 at desired locations and then reflowed to form solder balls. As desired or required, a solder mask (not shown) may be applied prior to solder ball formation, which solder mask may then be removed or remain for additional protection of back surface 114. Alternatively, conductive bumps may comprise masses of conductive or conductor-filled epoxy formed as columns or pillars.

In the instance that the semiconductor substrate 110 is in wafer form, such semiconductor substrate 110 may be singulated or separated into single or multiple but interconnected semiconductor dice prior to assembling such single or interconnected dice into a semiconductor device assembly with one or more other substrates.

Figure 4:
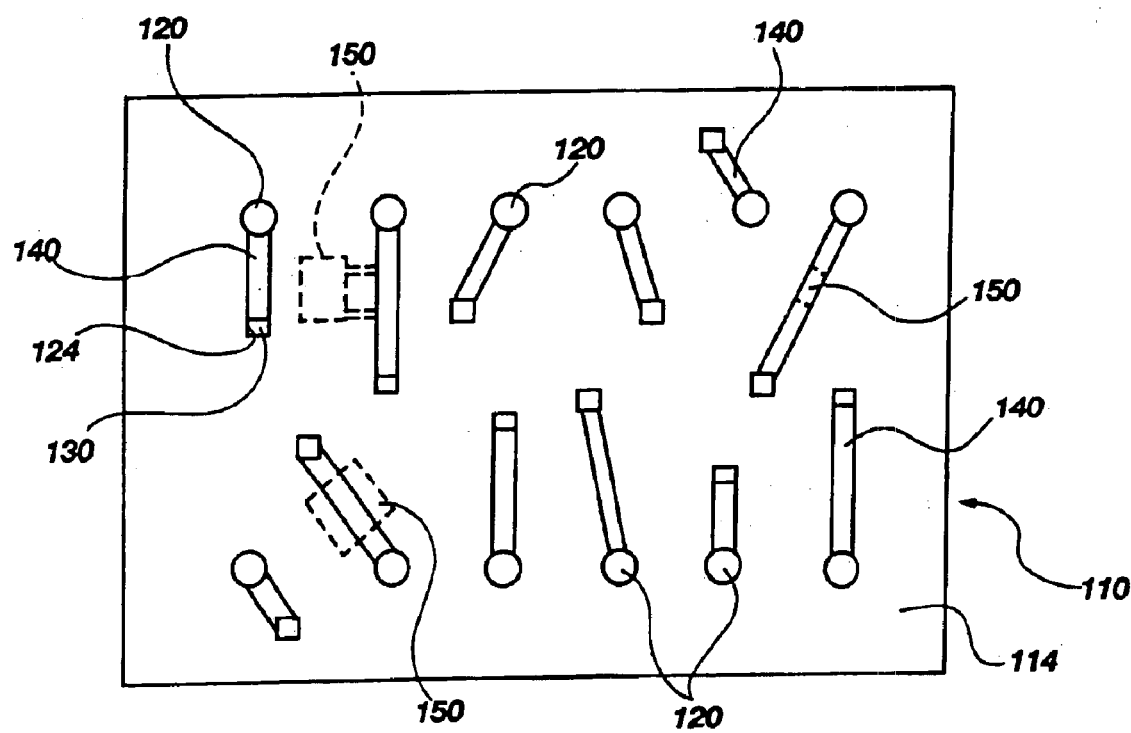
FIG. 4 illustrates a simplified plan view of the back surface of the semiconductor substrate of FIG. 3, depicting redistribution lines and additional electrical components on the back surface of the semiconductor substrate, according to the present invention.

FIG. 4 illustrates a simplified view of the back surface 114 of the semiconductor substrate 110 as a singulated semiconductor die. As shown, the vias 124 filled with conductive material 130 may appear to be formed in random locations since such vias 124 are preferably formed in portions of "dead space" in the semiconductor substrate 110, as previously discussed. The conductive material 130 in the vias 124 may then be electrically connected through redistribution lines 140 and conductive bumps 120 to correspond with a predetermined interconnect pattern of another substrate. Alternatively, such vias 124 may also be formed symmetrically in the semiconductor substrate and routed by the redistribution lines 140 to correspond with an appropriate predetermined electrical interconnect pattern of another substrate. The vias 124 may be located to, for example, accommodate or even balance physical stresses such as thermal stresses in the semiconductor substrate 110 attributable to mismatches in coefficients of thermal expansion (CTE) of the various materials employed therein, and to accommodate physical stresses resulting from assembly of semiconductor substrate 110 with other substrates due to CTE mismatches or residual stresses from fabrication processes and materials employed.

According to the present invention, the redistribution lines 140 may be interconnected to, or include, additional electronic components 150, such as capacitors, inductors, resistors, fuses, and controllers. Such electronic components 150 may provide advantages, such as providing improved RIC (resistance-inductance-capacitance) characteristics to the integrated circuitry of the semiconductor substrate 110. One especially suitable component comprises a decoupling capacitor for isolating the integrated circuitry on the active surface 112. Fabrication of electronic components 150 may be effected by any suitable methods known in the art and already practiced for forming the same electrical components on the active surface of a semiconductor substrate. Accordingly, no further discussion thereof is believed to be necessary.

Further, connecting conductive traces 132 extending from bond pads 122 to the redistribution lines 140 using a type A interconnection may result in improved impedance, less cross-talk between adjacent conductive traces 132 on the active surface 112, a smaller semiconductor die footprint, and additional space to provide discrete electronic components 150 on the back surface 114 of the semiconductor substrate 110. Using a type B interconnection eliminates any cross-talk whatsoever on the active surface 112, as the bond pad-equivalent connections provided by conductive material 130 in vias 124 remove the potential for electrostatic or electromagnetic interference from active surface 112.

Furthermore, the electronic components 150 provided in or on the back surface 114 of the semiconductor substrate 110 may be components conventionally provided on an active surface 112 of a semiconductor die or adjacently separate from a semiconductor die but electrically interconnected thereto. Thus, the present invention provides an effective increase in available "real estate" without increasing the footprint of semiconductor substrate 110 by providing electronic components 150 in or on the back surface 114 of the semiconductor substrate 110. In addition, as previously noted, the redistribution lines 140 are formed to extend to predetermined locations to interconnect through conductive bumps 120 with the interconnect pattern of another substrate, thus providing numerous possibilities for new semiconductor device assembly arrangements and attachment configurations for the semiconductor substrate 110 having the redistribution lines 140 on the back surface 114 thereof. Such semiconductor assembly device arrangements may include stacking semiconductor substrates with active surface-on-active surface attachment, back surface-on-active surface attachment, back surface-on-back surface attachment and active surface-on-back surface attachment of semiconductor substrates with, in each case, conductive bumps, studs, pillars or other interconnection elements extending transversely therebetween.

Figure 5:
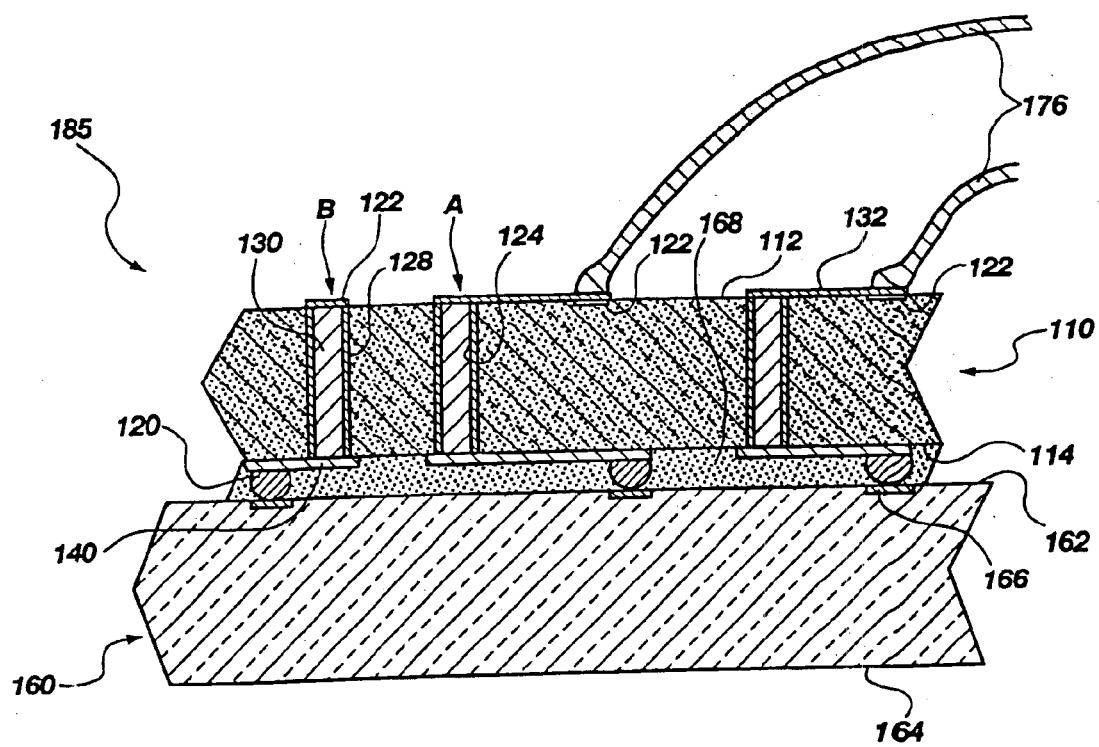
FIG. 5 illustrates a carrier substrate interconnected to the back surface of the semiconductor substrate of FIG. 3 with conductive bumps therebetween, according to the present invention.

FIG. 5 illustrates a semiconductor device assembly 185, wherein the back surface 114 of semiconductor substrate 110 is attached to a carrier substrate 160. The carrier substrate 160 includes a first surface 162 and a second surface 164. Conductive bumps 120 on the redistribution lines 140 extend transversely from back surface 114 to electrical interconnects in the form of contact pads or terminals 166 on first surface 162 of carrier substrate 160. The carrier substrate 160 may be formed from any suitable, rigid substrate material known in the art, such as silicon, a bismaleimide triazine (BT) resin, an FR-4 or FR-5 laminate, ceramic or epoxy resin, or a flexible material like a polymer such as a polyimide film, or other suitable polymeric material.

The conductive bumps 120 disposed on redistribution lines 140 are located, sized and configured to correspond with contact pads or terminals 166 on the first surface 162 of the carrier substrate 160 to make electrical and mechanical connection thereto. The contact pads or terminals 166 on the first surface 162 of the carrier substrate 160 may then be electrically interconnected to other electrical components peripheral to the semiconductor substrate 110 on carrier substrate 160 or to other components through higher-level packaging, such as a motherboard. With the semiconductor substrate 110 attached to the carrier substrate 160 with the active surface exposed and facing upward, such active surface may be interconnected to other components, such as another carrier substrate or interposer for interconnecting to one or more semiconductor dice. Additionally, if stacking additional semiconductor dice on semiconductor substrate 110 is not required, wire bonds 176 may be extended from selected bond pads 122 or conductive traces on the active surface 112 to the first surface 162 of the carrier substrate 160 or to other semiconductor substrates laterally proximate thereto and carried on carrier substrate 160.

As noted previously, conductive bumps 120 may include, but are not limited to, any particular known conductive materials or alloys thereof suitable for attaching flip-chip assemblies, such as tin/lead solder, copper, silver, gold and alloys thereof and conductive polymers and/or conductive composites. The conductive bumps may also be formed as layers of such materials and/or alloys thereof. Further, the conductive bumps may be formed as bumps, balls, pillars, columns and studs, or any other suitable physical structure.

Contact pads or terminals 166 reside on the carrier substrate 160. If solder is to be used for conductive bumps 120, pads (not shown) formed on a portion of the redistribution lines 140 at the intended distal locations of conductive bumps 120 may include an under bump metallization (UBM) laminated, multilayer metal structure as known in the art with an exposed, solder-wettable layer thereon, which may directly contact the conductive bump 120 and bond thereto after a reflow process at a predetermined temperature. The temperature may be determined by the solder alloy employed in the conductive bump 120 as known to one of ordinary skill in the art. A similar, solder-wettable layer may be formed on contact pads or terminals 166 on carrier substrate 160. In this manner, the semiconductor substrate 110 having the above-described redistribution lines 140 on the back surface thereof may be mounted to a carrier substrate 160.

After assembly of semiconductor substrate 110 with carrier substrate 160, a dielectric filler material 168 may be applied therebetween, surrounding conductive bumps 120. The presence of dielectric filler material 168 reduces the potential for corrosion of redistribution lines 140, eliminates any potential for moisture or particulate-induced shorting between conductive bumps 120, increases the mechanical strength of attachment between components of the semiconductor device and accommodates stress on the assembly due to thermal cycling and residual stresses in the substrates and materials used to interconnect them. The dielectric filler material 168 may comprise a polymeric material, such as an epoxy or an acrylic resin, and may contain inert filler material, such as silicon particles, therein to reduce costs. The dielectric filler material 168 may be introduced between the substrates using a dispensing needle or other nozzle, and distribution thereof between the substrates may be enhanced by introduction from multiple locations, by use of a vacuum opposite the introduction point or applied through an aperture in carrier substrate 160, by capillary action, by tilting the assembly from the horizontal to use gravity assist, or otherwise as known in the art.

Figure 6:
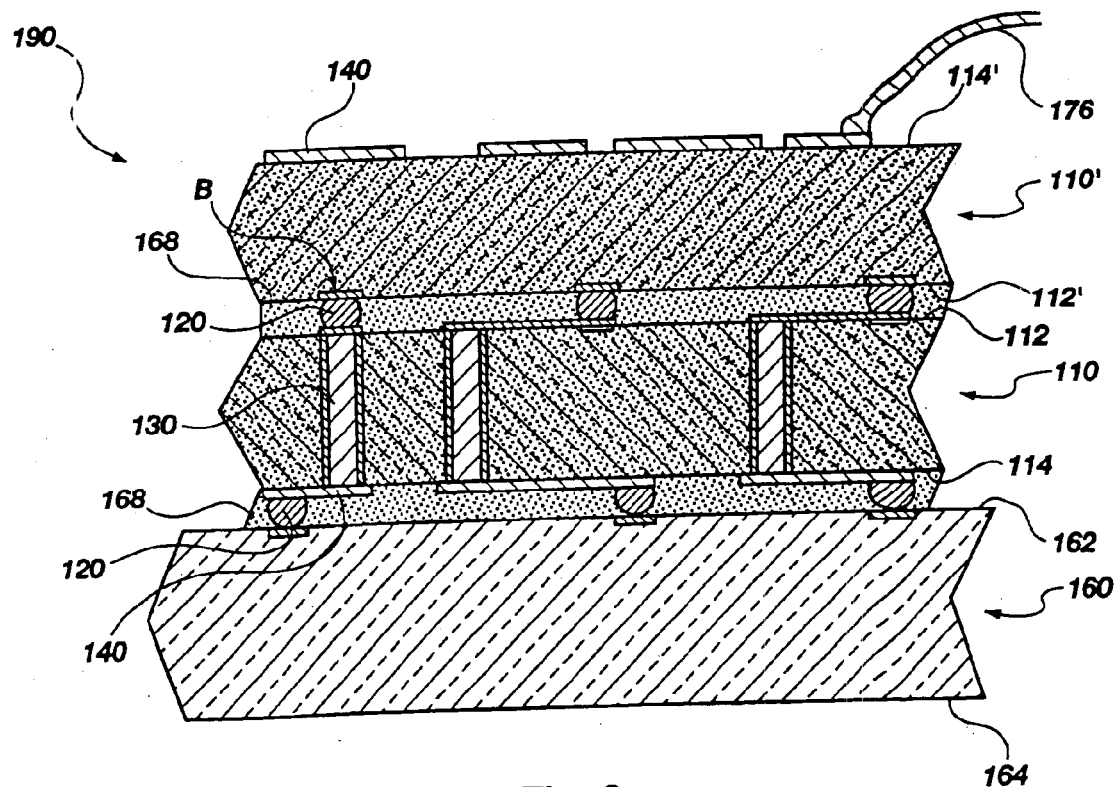
FIG. 6 illustrates a first embodiment of a stacked semiconductor device assembly according to the present invention.

FIG. 6 illustrates a first embodiment of a stacked semiconductor device assembly 190 according to the present invention. The first embodiment 190 may include the active surface 112 of the semiconductor substrate 110 attached and electrically connected to an active surface 112' of a second, flip-chip configured semiconductor substrate 110' with conductive bumps 120 therebetween. In this manner, there are two semiconductor substrates 110 and 110' attached active surface-to-active surface with back surface 114' of the second semiconductor substrate 110' exposed upward. Similar to semiconductor substrate 110, the second semiconductor substrate 110' may optionally include redistribution lines 140 on the back surface 114' thereof with additional electronic components 150 (not shown). Also, stacked semiconductor device assembly 190 depicts interconnect type B being utilized as a direct link for active circuitry in semiconductor substrate 110' to interconnect with carrier substrate 160, either in combination with or in isolation from, as desired, the active circuitry on the active surface 112 of semiconductor substrate 110.

From the redistribution lines 140 on the second semiconductor substrate 110', wire bonds 176 may be optionally formed and the stacked semiconductor device assembly 190 may be encapsulated with a dielectric encapsulation material (not shown). Dielectric filler material 168 may be provided between semiconductor substrates 110 and 110' and between the semiconductor substrate 110 and the carrier substrate 160, as previously described.

Figure 7:
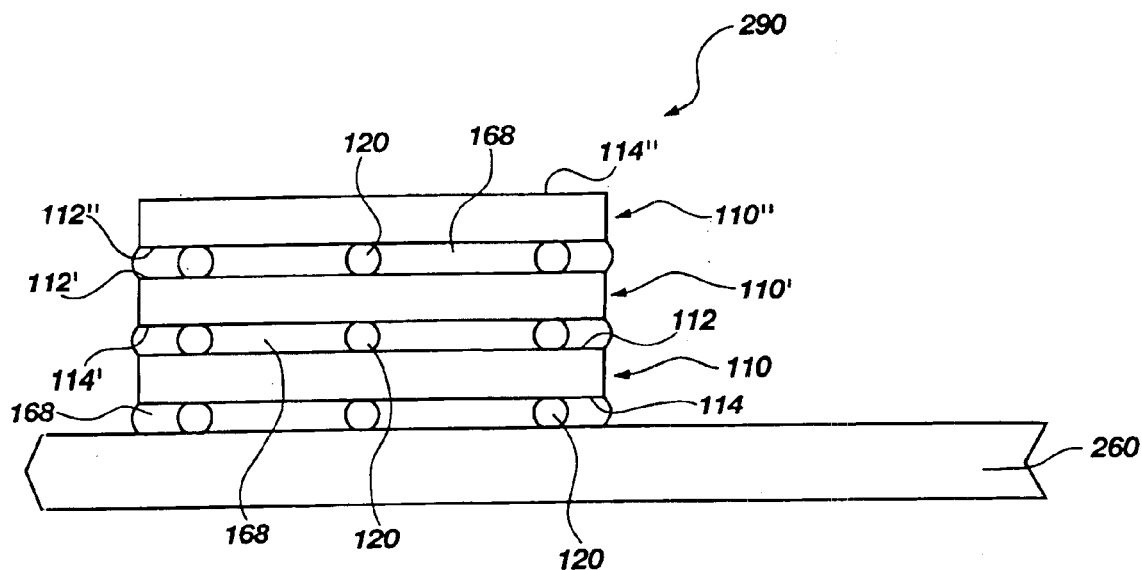
FIG. 7 illustrates a second embodiment of a stacked semiconductor device assembly according to the present invention.

FIG. 7 depicts a stacked semiconductor device assembly 290 with a plurality of semiconductor substrates 110, 110', 110" having the redistribution lines 140 (not shown) on their back surfaces 114, according to a second embodiment of the present invention. The second embodiment is similar to the first stacked semiconductor device embodiment, except back surface 114' of second semiconductor substrate 110' is attached to active surface 112 of first semiconductor substrate 110 with conductive bumps 120 and dielectric filler material 168 therebetween. A third semiconductor substrate 110" having a back surface 114" may also be stacked on semiconductor substrate 110' so that active surface 112' of second semiconductor substrate 110' faces and is attached to active surface 112" of third semiconductor substrate 110" with conductive bumps 120 and dielectric filler material 168 therebetween. Alternatively, third semiconductor substrate 110" may also be oriented with active 112" surface up and connect with second semiconductor substrate 110' through redistribution lines 140 (not shown). With this arrangement, there are three semiconductor substrates 110, 110' and 110" stacked to carrier substrate 260 in the stacked semiconductor device assembly 290, wherein at least first semiconductor substrate 110 and second semiconductor substrate 110' each include the redistribution lines 140 (not shown in FIG. 7) of the present invention since such first and second semiconductor substrates 110 and 110' are interconnected electrically through their back side surfaces.

Figure 8:
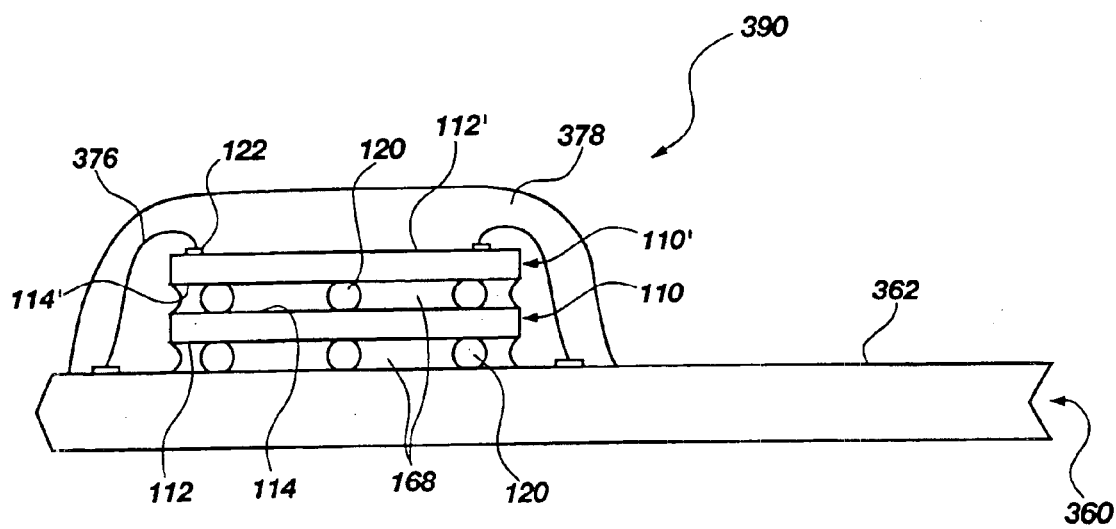
FIG. 8 illustrates a third embodiment of a stacked semiconductor device assembly according to the present invention.

FIG. 8 depicts a stacked semiconductor assembly 390 with semiconductor substrates 110 and 110' attached in a back-to-back arrangement, according to a third embodiment of the present invention. As depicted, a first semiconductor substrate 110 is attached in a typical flip-chip attachment, wherein active surface 112 of first semiconductor substrate 110 is attached face down to carrier substrate 360 with conductive bumps 120 and dielectric filler material 168 therebetween. A back surface 114' of second semiconductor substrate 110' is attached to back surface 114 of first semiconductor substrate 110. Wire bonds 376 maybe optionally provided from the active surface 112' of second semiconductor substrate 110' to a first surface 362 of carrier substrate 360, after which an encapsulation material 378 may be provided to at least encapsulate the active surface 112' and wire bonds 376 extending therefrom. With this stacked semiconductor device assembly 390, the back surface-to-back surface arrangement of semiconductor substrates 110 and 110' may be employed since electrical interconnection therebetween may be made through the redistribution lines of the present invention on each of the back surfaces 114 thereof.

Figure 9:
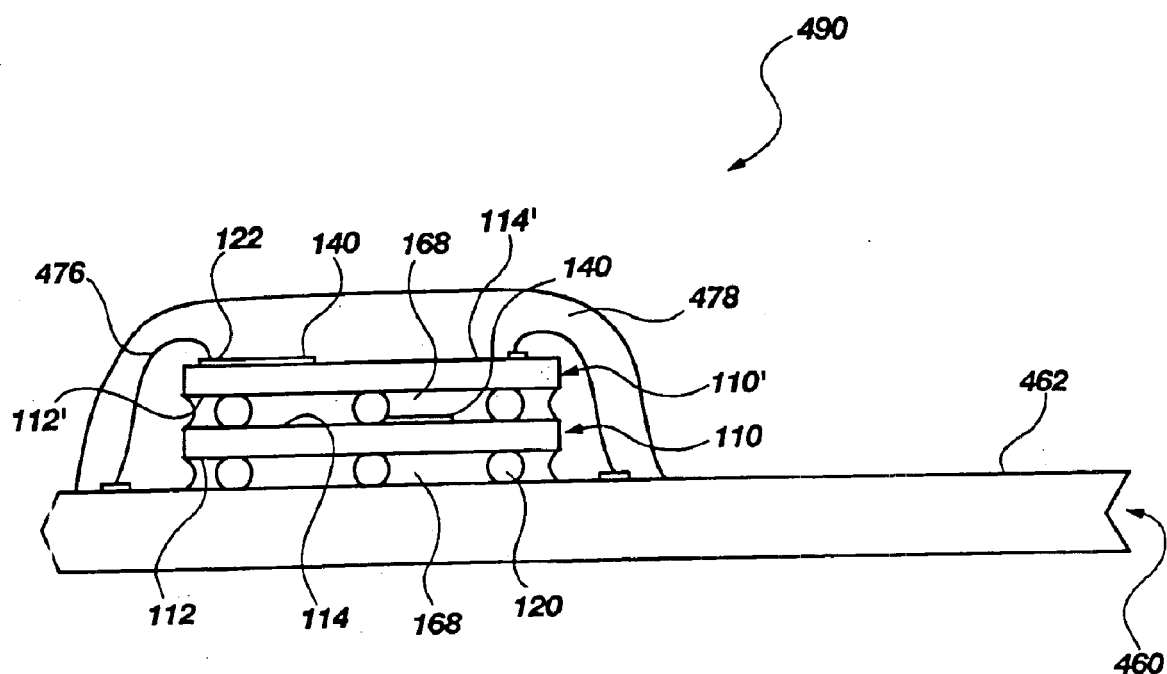
FIG. 9 illustrates a fourth embodiment of a stacked semiconductor device assembly according to the present invention.

FIG. 9 depicts a stacked semiconductor device assembly 490 with semiconductor substrates 110 and 110' attached in an active surface-to-back surface arrangement, according to a fourth embodiment of the present invention. In this embodiment, a first semiconductor substrate 110 is attached to first surface 462 of carrier substrate 460 in a flip-chip type attachment with active surface 112 of first semiconductor substrate 110 attached face down to carrier substrate 460 with conductive bumps 120 and filler material 168 therebetween. An active surface 112' of second semiconductor substrate 110' may then be attached by conductive bumps 120 to back surface 114 of first semiconductor substrate 110. If required or desired, wire bonds 476 may be provided from bond pads 122 or redistribution lines 140 on back surface 114' of second semiconductor substrate 110' to carrier substrate 460 with dielectric encapsulation material 478 thereover. With this stacked semiconductor device assembly 490, the back surface 114 of first semiconductor substrate 110 may include the redistribution lines of the present invention to provide an electrical interconnection for second semiconductor substrate 110'. However, second semiconductor substrate 110' may or may not include the back surface redistribution lines 140 of the present invention.

Figure 10:
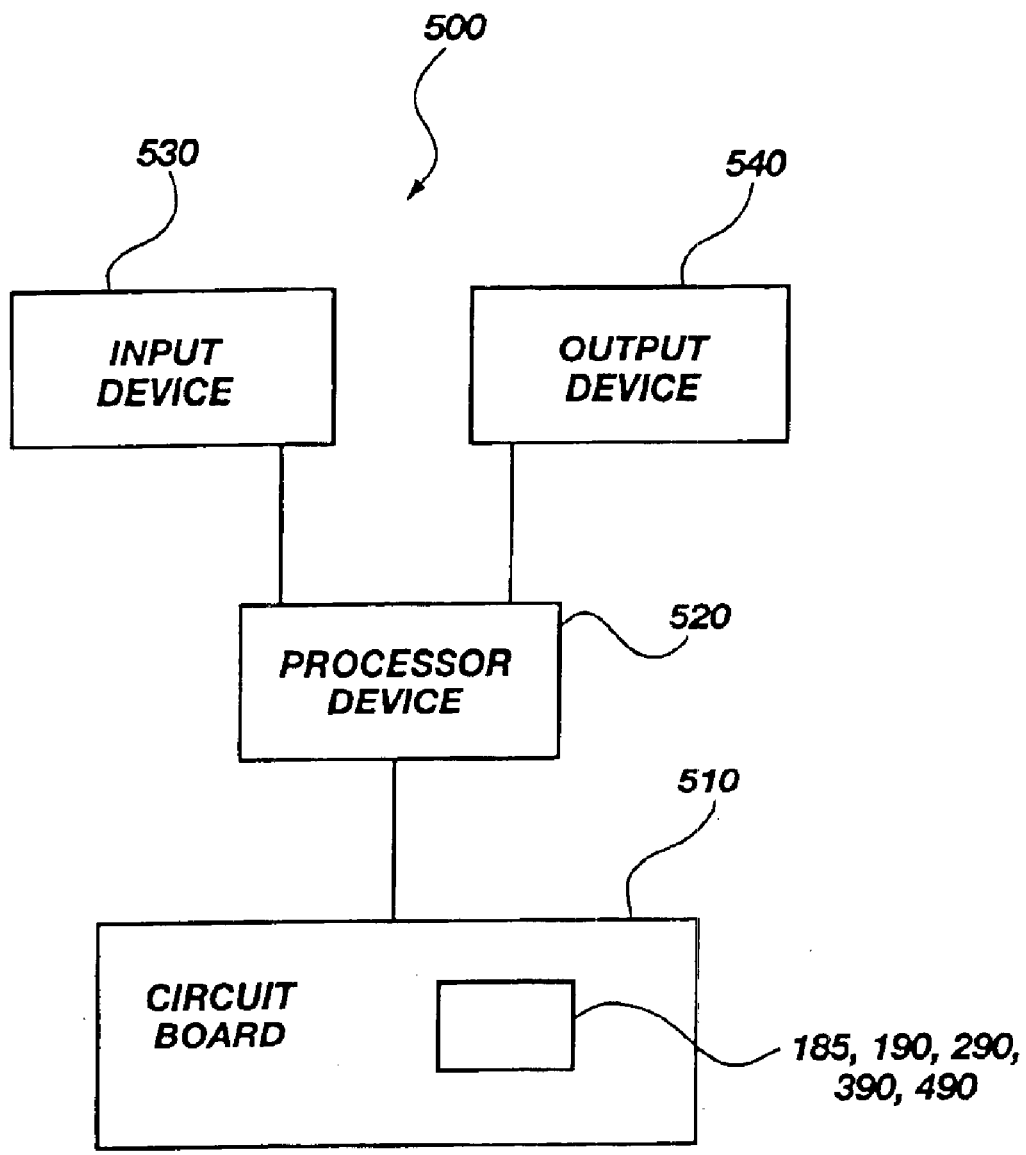
FIG. 10 illustrates a simplified block diagram of a semiconductor device assembly of the present invention in an electronic system.

As illustrated in block diagram form in drawing FIG. 10, semiconductor device assembly 185 or stacked semiconductor device assemblies 190, 290, 390, 490 of the present invention may be mounted to a circuit board 510, such as a memory module, daughter board or motherboard, in an electronic system 500, such as a computer system. In the electronic system 500, the circuit board 510 may have connected thereto a processor device 520, which also communicates with an input device 530 and an output device 540. The input device 530 may comprise one or more of a keyboard, mouse, joystick or any other type of electronic input device. The output device 540 may comprise one or more of a monitor, printer or storage device, such as a disk drive, or any other type of output device. The processor device 520 may be, but is not limited to, a microprocessor or a circuit card including hardware in the form of a central processing unit, or CPU, for processing instructions for the electronic system 500. Additional structure for the electronic system 500 is readily apparent to those of ordinary skill in the art.

The use of extremely small vias according to the present invention provides the opportunity to substantially reduce the pitch, or spacing, between contacts on a semiconductor substrate. For example, conventional bond pads, with a size approximating 100 μm, may require a minimum pitch of 250 μm or even greater, due to fabrication issues. Using 25 μm diameter vias according to the present invention enables a pitch reduction between adjacent vias to 100 μm, or even less.

Likewise, the use of a redistribution layer on the back surface of a semiconductor substrate enables the formation of a fully populated array of conductive bumps at a very wide, easily usable pitch of about 350 μm. Further, the availability of the entire back surface of a semiconductor substrate and the great extent and wide pitch of the redistribution lines and conductive bumps thereover spreads out, or distributes, stresses manifested in the semiconductor substrate under thermal cycling during testing, bum-in and subsequent normal operation of the integrated circuitry due to different CTEs of the materials used in fabricating the semiconductor substrate. The presence of the redistribution lines themselves on the back surface of the semiconductor substrate may be used to compensate the substrate for residual stresses induced by fabrication of the integrated circuitry on the active surface as well as for mismatched CTE-induced stresses attributable to thermal cycling.

While the present invention has been disclosed in terms of certain preferred embodiments and alternatives thereof, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of making a semiconductor substrate, the method comprising:
providing at least one semiconductor die having an active surface and a back surface, the at least one semiconductor die defining at least one via having a substantially uniform cross section therethrough extending from the active surface to the back surface thereof;
disposing conductive material in the at least one via to substantially extend therethrough from the active surface to the back surface of the at least one semiconductor die wherein the conductive material completely fills the at least one via;
forming at least one electrically conductive redistribution line on the active surface of the at least one semiconductor die in electrical communication with the conductive material of the at least one via and extending to a predetermined location on the active surface of the at least one semiconductor die remote from the location of the at least one via; and
forming at least one electrically conductive redistribution line on the back surface of the at least one semiconductor die in electrical communication with the conductive material of the at least one via and extending to a predetermined location on the back surface of the at least one semiconductor die remote from the location of the at least one via.

2. The method of claim 1, wherein providing comprises:
forming the at least one via in the active surface of the at least one semiconductor die to extend partially through the at least one semiconductor die;
filling the at least one via with the conductive material; and
removing material from the back surface of the at least one semiconductor die to expose the conductive material in the at least one via.

3. The method of claim 2, wherein forming the at least one via comprises at least one of drilling and laser ablation.

4. The method of claim 2, wherein filling comprises depositing conductive material over the active surface to fill the at least one via.

5. The method of claim 2, wherein removing comprises:
grinding the material from the back surface of the at least one semiconductor die; and
applying at least one of a wet etch and a dry etch on the back surface to expose the conductive material on the back surface.

6. The method of claim 2, wherein removing comprises abrasively removing.

7. The method of claim 2, wherein removing comprises:
grinding the material from the back surface of the at least one semiconductor die; and
abrasively polishing the back surface to expose the conductive material on the back surface and to planarize the back surface.

8. The method of claim 1, wherein disposing the conductive material comprises doping a matrix material of the at least one semiconductor die to simultaneously define the at least one via and render it conductive.

9. The method of claim 1, wherein forming comprises:
depositing a redistribution layer precursor on the back surface of the at least one semiconductor die; and
patterning the redistribution layer to define the at least one electrically conductive redistribution line on the back surface.

10. The method of claim 9, wherein patterning comprises selectively masking and etching the redistribution layer precursor to remove excess material of the redistribution layer precursor to form the at least one electrically conductive redistribution line on the back surface.

11. The method of claim 1, wherein forming comprises printing the at least one electrically conductive redistribution line on the back surface.

12. The method of claim 1, wherein forming comprises applying the at least one electrically conductive redistribution line as a preform to the back surface.

13. The method of claim 1, wherein forming comprises positioning a conductive bump on a portion of the at least one electrically conductive redistribution line proximate the predetermined location.

14. A method of assembling a semiconductor assembly comprising:
providing a substrate having a first surface and a second surface and at least one electrical interconnect on the first surface;
providing a first semiconductor die having an active surface bearing integrated circuitry and a back surface, the first semiconductor die defining at least one via having a substantially uniform cross section extending from the active surface to the back surface with conductive material formed therein, wherein the conductive material completely fills the at least one via, the active surface having at least one redistribution line thereon extending from the conductive material in the at least one via to a predetermined location on the active surface, the back surface having at least one redistribution line thereon extending from the conductive material in the at least one via to a predetermined location on the back surface; and attaching the back surface of the first semiconductor die to the first surface of the substrate so that the at least one electrical interconnect on the first surface is electrically connected to the at least one redistribution line at the predetermined location on the back surface of the first semiconductor die.

15. The method of claim 14, wherein the attaching further comprises connecting the at least one redistribution line on the back surface of the first semiconductor die to the at least one electrical interconnect with a conductive bump extending transversely therebetween.

16. The method of claim 15, further comprising applying a dielectric filler material between the back surface of the first semiconductor die and the first surface of the substrate to fill a gap therebetween.

17. The method of claim 14, wherein the at least one redistribution line on the back surface comprises a plurality of redistribution lines and the at least one electrical interconnect comprises a plurality of electrical interconnects, wherein the predetermined locations of the redistribution lines of the plurality are located to correspond to a pattern of the plurality of electrical interconnects.

18. The method of claim 14, further comprising providing a second semiconductor die having an active surface bearing integrated circuitry and a back surface and electrically connecting the second semiconductor die to the active surface of the first semiconductor die.

19. The method of claim 18, wherein providing the second semiconductor die comprises providing the second semiconductor die to define at least one via extending from the active surface to the back surface thereof with conductive material formed therein, the back surface of the second semiconductor die having at least one redistribution line thereon in electrical communication with the conductive material in the at least one via thereof and extending to a predetermined location on the back surface of the second semiconductor die.

20. The method of claim 19, further comprising electrically connecting the back surface of the second semiconductor die to the active surface of the first semiconductor die so that at least one conductive element on the active surface of the first semiconductor die is electrically connected to the at least one redistribution line at the predetermined location on the back surface of the second semiconductor die.

21. The method of claim 20, further comprising forming wire bonds from the active surface of the second semiconductor die to the first surface of the substrate.

22. The method of claim 21, further comprising encapsulating at least the wire bonds with encapsulation material.

23. The method of claim 20, wherein electrically connecting the back surface of the second semiconductor die to the active surface of the first semiconductor die comprises connecting the at least one redistribution line on the back surface of the second semiconductor die to the at least one conductive element with a conductive bump.

24. The method of claim 23, further comprising applying a dielectric filler material between the back surface of the second semiconductor die and the active surface of the first semiconductor die to fill a gap therebetween.

25. The method of claim 18, further comprising electrically connecting the active surface of the second semiconductor die to the active surface of the first semiconductor die with conductive bumps therebetween.

26. The method of claim 25, further comprising applying a dielectric filler material between the active surface of the second semiconductor die and the active surface of the first semiconductor die to fill a gap therebetween.

27. The method of claim 18, further comprising providing a third semiconductor die having an active surface bearing integrated circuitry and a back surface.

28. The method of claim 27, further comprising electrically connecting the active surface of the second semiconductor die to the active surface of the third semiconductor die with conductive bumps therebetween.

* * * * *